US010553285B2

(12) United States Patent
Zamir et al.

(10) Patent No.: US 10,553,285 B2
(45) Date of Patent: Feb. 4, 2020

(54) SINGLE-PORT MEMORY WITH OPPORTUNISTIC WRITES

(71) Applicant: WESTERN DIGITAL TECHNOLOGIES, INC., San Jose, CA (US)

(72) Inventors: Ran Zamir, Ramat Gan (IL); David Avraham, Even-Yuheda (IL); Eran Sharon, Rishon Lezion (IL); Idan Alrod, Herzliya (IL)

(73) Assignee: Western Digital Technologies, Inc., San Jose, CA (US)

( * ) Notice: Subject to any disclaimer, the term of this patent is extended or adjusted under 35 U.S.C. 154(b) by 149 days.

(21) Appl. No.: 15/824,038

(22) Filed: Nov. 28, 2017

(65) Prior Publication Data

US 2019/0164610 A1 May 30, 2019

(51) Int. Cl.
*G11C 16/10* (2006.01)
*G11C 29/52* (2006.01)
*H03M 13/11* (2006.01)
*G11C 11/419* (2006.01)
*G06F 12/10* (2016.01)
(Continued)

(52) U.S. Cl.
CPC ............ *G11C 16/10* (2013.01); *G06F 11/108* (2013.01); *G06F 11/1012* (2013.01); *G06F 11/1068* (2013.01); *G06F 12/10* (2013.01); *G11C 11/419* (2013.01); *G11C 29/52* (2013.01); *H03M 13/1128* (2013.01); *G06F 2212/1024* (2013.01); *G06F 2212/202* (2013.01); *G11C 7/1042* (2013.01); *G11C 2029/0411* (2013.01)

(58) Field of Classification Search
CPC ....... G11C 16/10; G11C 11/419; G11C 29/52; G11C 7/1042; G11C 2029/0411; G06F 11/1012; G06F 11/1068; G06F 11/108; G06F 12/10; G06F 2212/1024; G06F 2212/202; H03M 13/1128
See application file for complete search history.

(56) References Cited

U.S. PATENT DOCUMENTS 6,055,606 A * 4/2000 Sharma ............... G06F 12/0804
365/230.05
8,238,191 B2 * 8/2012 Yu ............................ G11C 8/16
365/189.04

(Continued)

OTHER PUBLICATIONS

Ishii, Y., et al., "A 28nm 360ps-Access-Time Two-Port SRAM with a Time-Sharing Scheme to Circumvent Read Disturbs," 2012 IEEE International Solid-State Circuits Conference, Published: Apr. 3, 2012, Date of Conference: Feb. 19-23, 2012, pp. 236-238 . (Year: 2012).*

*Primary Examiner* — Kyle Vallecillo
(74) *Attorney, Agent, or Firm* — Vierra Magen Marcus LLP

(57) ABSTRACT

An apparatus includes a first single-port memory, a second single-port memory, and one or more control circuits in communication with the first single-port memory and in communication with the second single-port memory. The one or more control circuits are configured to initiate a read of stored data on a clock cycle from a physical location of the stored data in the first or second single-port memory and to initiate a write of fresh data on the clock cycle to whichever of the first single-port memory or the second single-port memory does not contain the physical location of the stored data.

20 Claims, 17 Drawing Sheets

(51) Int. Cl.
*G06F 11/10* (2006.01)
*G11C 7/10* (2006.01)
*G11C 29/04* (2006.01)

(56) References Cited

U.S. PATENT DOCUMENTS

| | | | |
|---|---|---|---|
| 2004/0190604 A1* | 9/2004 | Bhora | H04B 1/7093 375/150 |
| 2005/0091465 A1* | 4/2005 | Andreev | G06F 5/16 711/168 |
| 2011/0052912 A1* | 3/2011 | Poivet | C08G 18/10 428/355 N |
| 2011/0194370 A1* | 8/2011 | Shiu | G11C 8/18 365/230.03 |
| 2012/0144103 A1* | 6/2012 | Ko | G11C 7/1075 711/104 |
| 2013/0290646 A1* | 10/2013 | Greenwood | H04L 49/90 711/149 |
| 2014/0052913 A1* | 2/2014 | Wang | G11C 7/1075 711/119 |
| 2016/0320989 A1* | 11/2016 | Bromberg | G06F 13/1684 |
| 2016/0328158 A1* | 11/2016 | Bromberg | G06F 3/0611 |
| 2017/0364408 A1* | 12/2017 | Sherman | G06F 13/4022 |
| 2018/0150253 A1* | 5/2018 | Chen | G11C 8/10 |
| 2018/0188972 A1* | 7/2018 | Yang | G11C 7/1006 |
| 2018/0287636 A1* | 10/2018 | Rom | G06F 3/0619 |

* cited by examiner

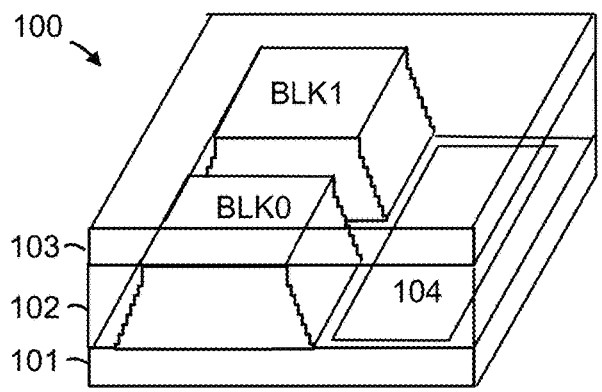
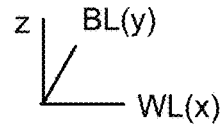
Figure 1
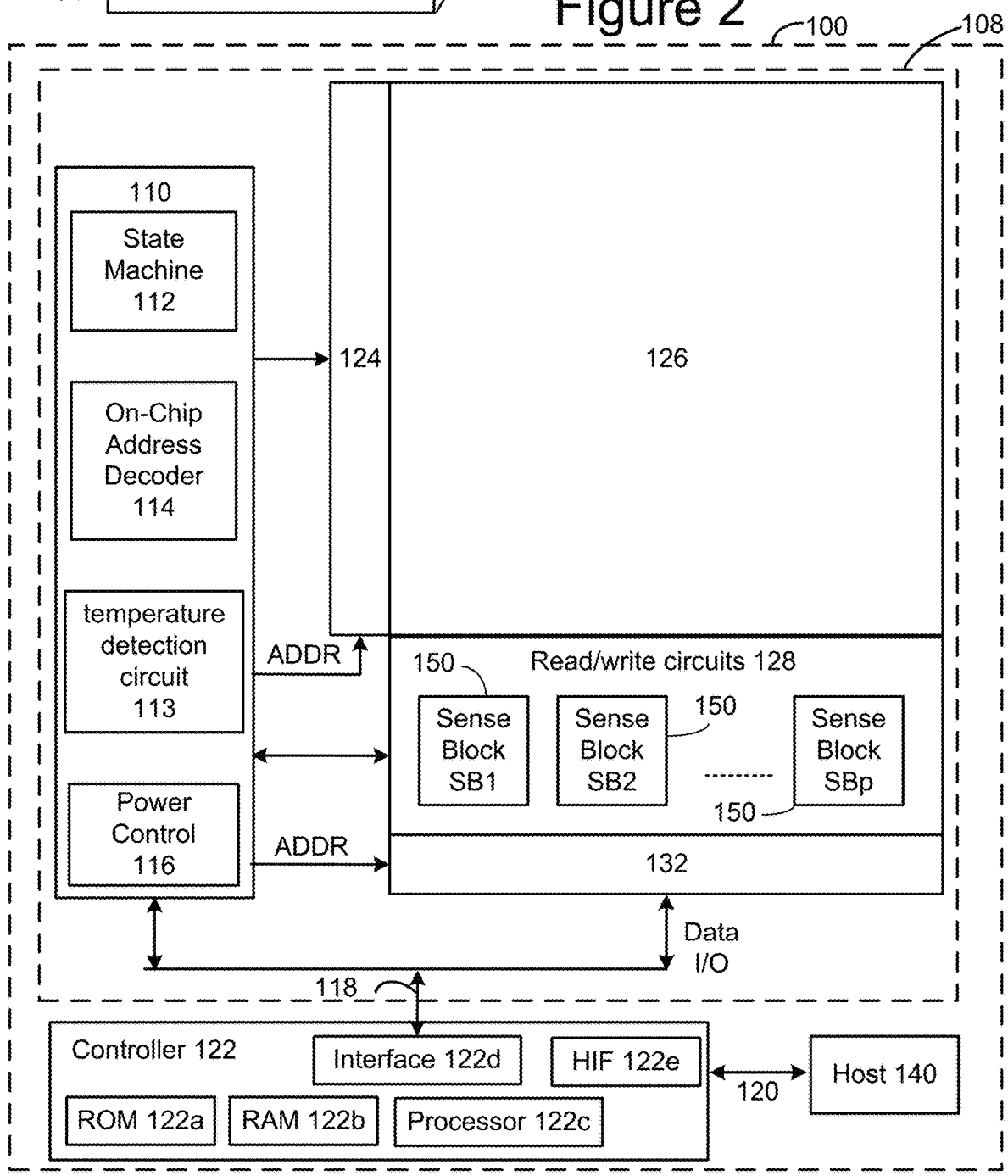
Figure 2

Figure 4D
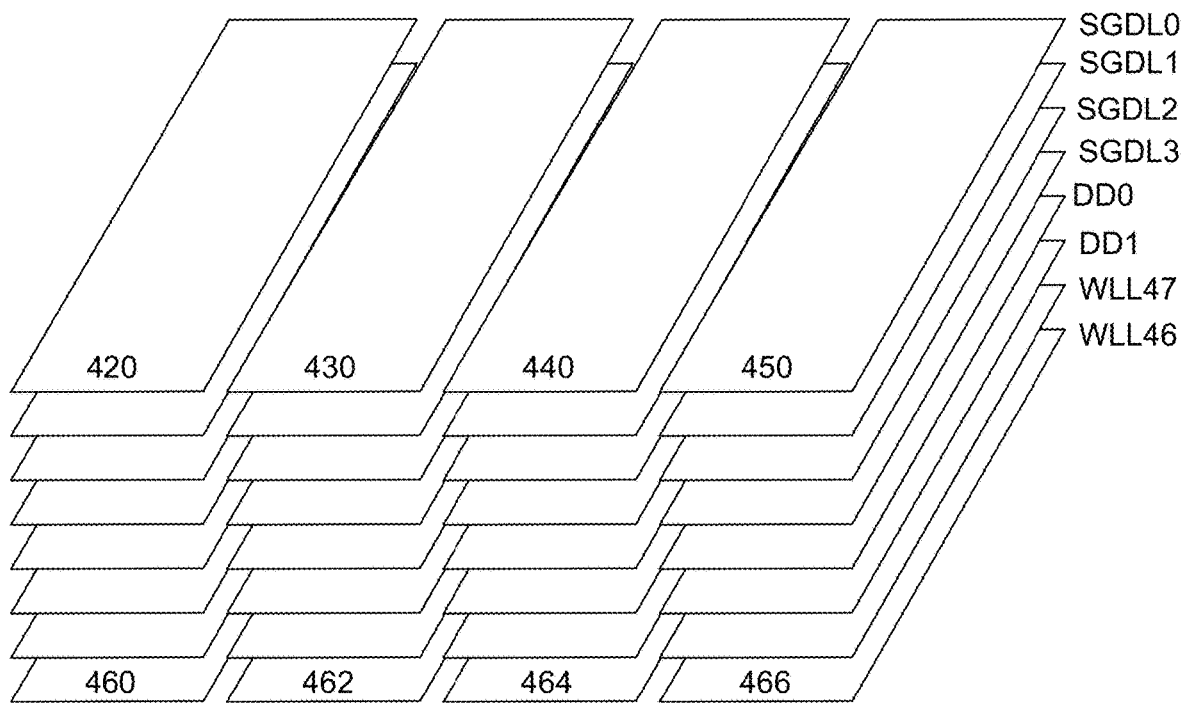
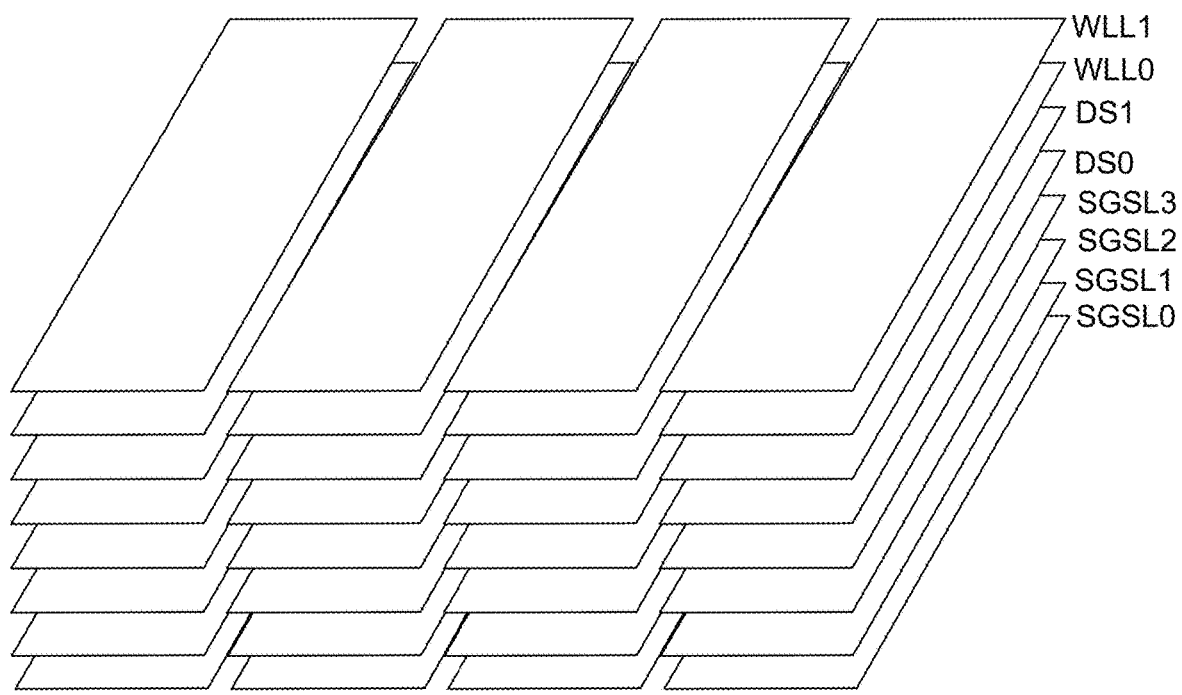

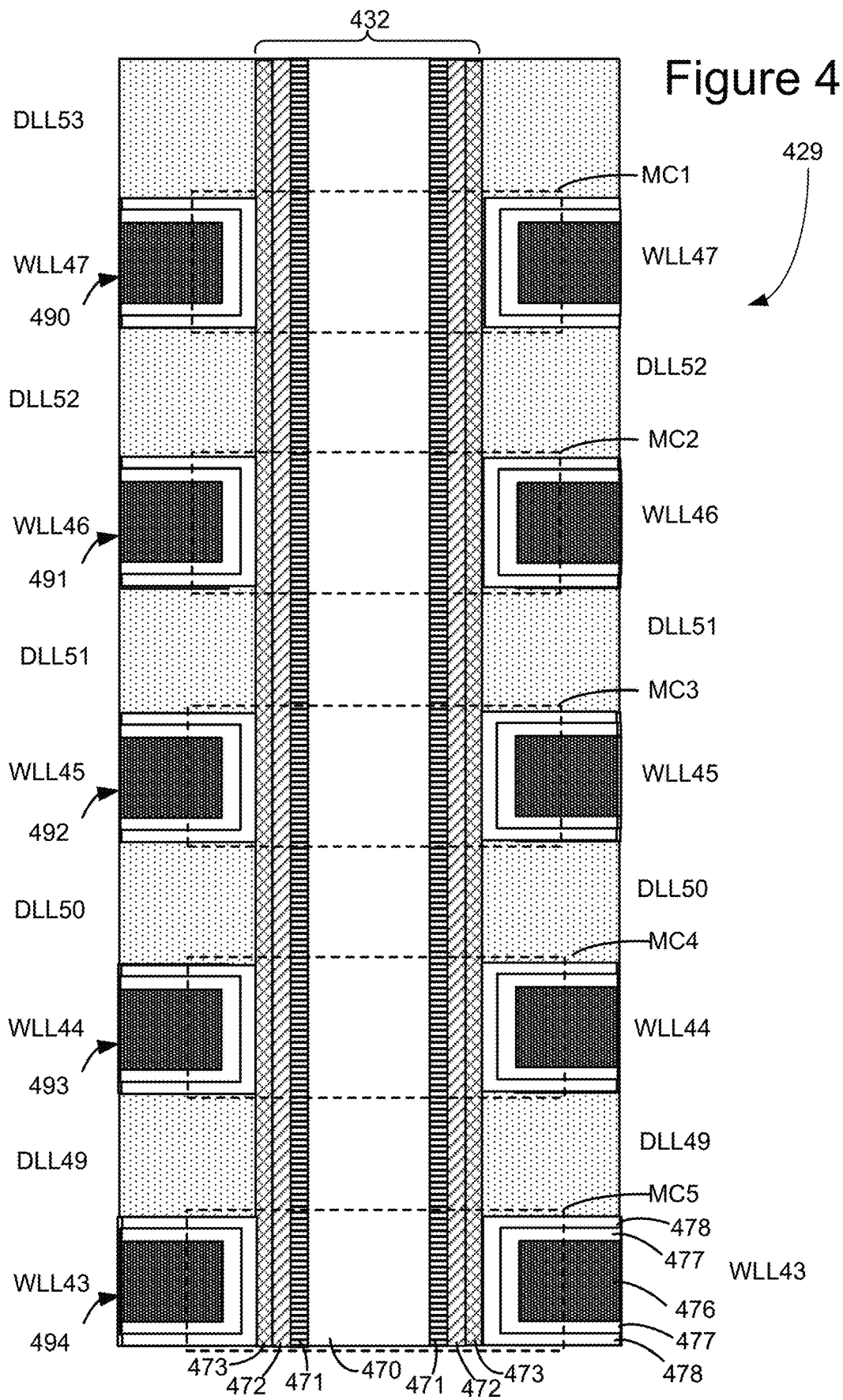

|  | Area | Power |
|---|---|---|
| Single Port | 100% | 100% |
| 2-port ultra-high-density | ~100% | ~160% |
| 2-port high-density | ~200% | ~100% |

Figure 9

| clock  | 0   | 1   | 2   | 3   | 4   | 5   | 6   | 7   | 8 |
|--------|-----|-----|-----|-----|-----|-----|-----|-----|---|
| Port A | 100 | 101 | 102 | 103 | 104 | 105 | 106 | 107 | ... |
| Port B | 672 | 673 | 674 | 675 | 676 | 677 | 678 | 679 | ... |

Figure 10

| clock  | 0      | 1   | 2   | 3   | 4   | 5   | 6   | 7   | 8 |
|--------|--------|-----|-----|-----|-----|-----|-----|-----|---|
| Port A | 100    | 101 | 102 | 103 | 104 | 105 | 106 | 107 | ... |
| Port B | 672(w) | 672 | 673 | 674 | 675 | 676 | 677 | 678 | ... |

Figure 11

| Clock  | 0    | 1    | 2 | 3     | 4     |
|--------|------|------|---|-------|-------|
| Port A | 4    | 2(w) | 2 | 47    | 17(w) |
| Port B | 6(w) | 6    | 5 | 23(w) | 23    |

Figure 12

| Clock  | 0 | 1 | 2  | 3  | 4  |
|--------|---|---|----|----|----|
| Port A | 4 | 2 | 47 | 17 | 20 |
| Port B | 6 | 5 | 23 | 8  | 11 |

Figure 13A
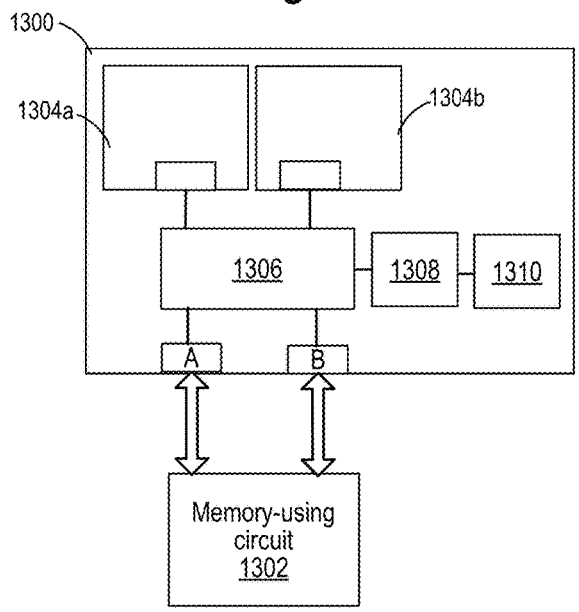
Figure 13B
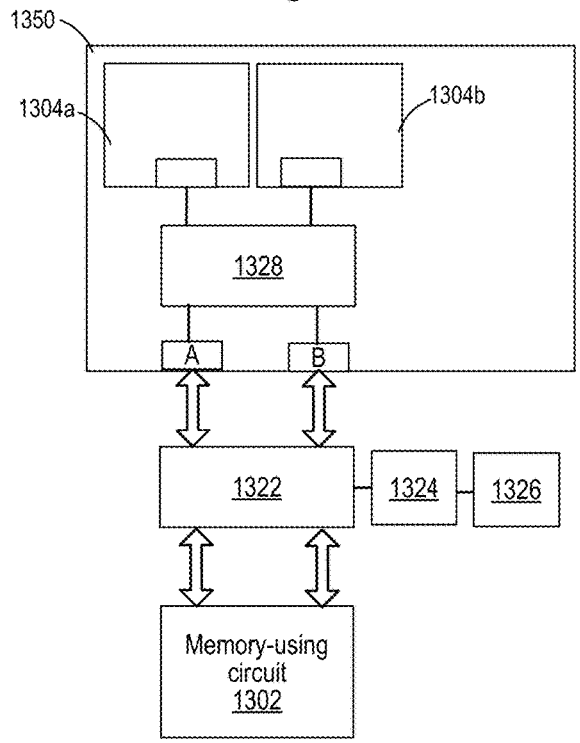
Figure 14
| Logical Address | Physical Address |
|---|---|
| 0 | 23 |
| 1 | 4 |
| : | : |
| N-1 | 15 |

Figure 15

| Clock | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Read | 0 | 8 | 17 | 47 | 78 | 4 | 5 | 33 | 46 | 60 | 10 | 11 | 12 | 43 | 44 | ... |
| Write | | | | | | | | 0 | 8 | 17 | 47 | 77 | 4 | 5 | 33 | ... |
| Bias | | | | | | | | 1 | 2 | 3 | 4 | 3 | 2 | 1 | 0 | ... |

Figure 16 initializing a logical to physical map of a logical address space to a physical memory space according to an initial mapping, the physical memory space includes a first single-port memory and a second single-port memory — 1660 writing fresh data at locations in the first single-port memory and the second single-port memory according to the initial mapping during an initial period of operation; — 1662 subsequent to the initial period of operation, writing fresh data on a clock cycle to whichever of the first single-port memory or the second single-port memory is not busy with a read command on the clock cycle. — 1664

SINGLE-PORT MEMORY WITH OPPORTUNISTIC WRITES

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in an electronic device, the non-volatile memory system may program data, read data and/or erase data. Errors may occur in data when the data is programmed, or after programming while the data is stored in the non-volatile memory. To allow such errors to be corrected, some redundant data may be calculated and stored with user data according to an encoding scheme. Encoding data prior to storage and decoding data read from a non-volatile memory may be performed by an Error Correction Code (ECC) encoder/decoder in a non-volatile memory system.

BRIEF DESCRIPTION OF THE DRAWINGS

Like-numbered elements refer to common components in the different figures.

FIG. 1 is a perspective view of a 3D stacked non-volatile storage device.

FIG. 2 is a functional block diagram of a storage device of FIG. 1.

FIG. 4D depicts a view of the select gate layers and word line layers.

FIG. 4E is a cross sectional view of a vertical column of memory cells.

FIG. 9 shows an example of operation of a dual-port memory.

FIG. 10 shows an example of operation of two single-port memories with sequential accesses.

FIG. 11 shows an example of operation of two single-port memories with non-sequential accesses.

FIG. 12 illustrates an example of operation of two single-port memories with non-sequential accesses and opportunistic writes.

FIG. 13A shows an example of single-port memories with control circuits.

FIG. 13B shows another example of single-port memories with control circuits.

FIG. 14 illustrates a logical to physical map or table.

FIG. 15 illustrates bias between two single-port memories using opportunistic writes.

FIG. 16 illustrates a method that includes writing fresh data to whichever single-port memory is not busy with a read.

DETAILED DESCRIPTION

Figure 3:
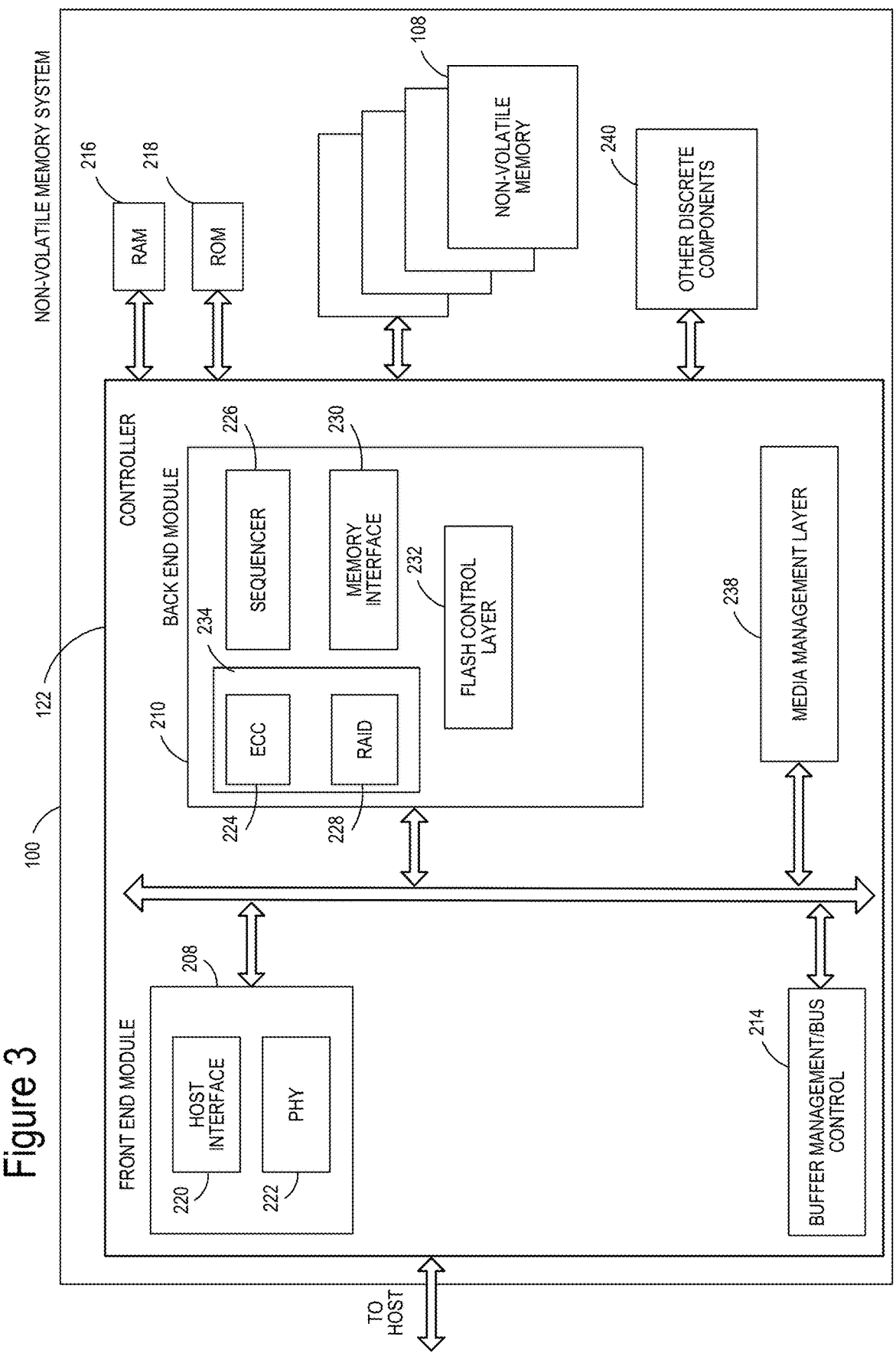
FIG. 3 is a block diagram depicting one embodiment of a Controller.

In some applications, data in a Random Access Memory (RAM) may be accessed frequently, e.g. by performing both a read and a write on a given clock cycle. Such parallel read and write operations may be handled by a dual-port memory. However, dual-port memory has some drawbacks. While single-port memories may be used to allow parallel read and write access in some applications, using single-port memories may incur delays whenever a read and a write are directed to the same single-port memory. This may be a significant factor where access is non-sequential, e.g. access to RAM by an iterative ECC decoder such as a Low Density Parity Check (LDPC) decoder.

Two single-port memories may be accessed in parallel by directing a read to whichever single-port memory stores the data to be read and, in parallel (e.g. on same clock cycle), directing an opportunistic write to whichever single-port memory is not busy performing the read (i.e. to the single-port memory that does not store the data to be read). Physical data locations may be tracked using a logical to physical map or table. Thus, assignment of logical addresses to single-port memories is done on the fly and data with a given logical address may be stored in either single-port memory.

One single-port memory may tend to receive more writes, thus creating bias, which may require additional memory capacity. In order to reduce bias, an initial mapping may be generated that is found to provide low bias based on a pattern of access for a particular memory user. The logical to physical map may be initialized according to the initial mapping, which may be used for some initial period. Low bias requires a small amount of additional memory capacity so that combined single-port memory capacity may be a little greater than a dual-port memory for the same application.

FIGS. 1-4F describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b, Memory Interface 122d and Host Interface 122e, all of which are interconnected. One or more processors 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular, and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

FIG. 3 is a block diagram of example memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid-state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of memory die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126.

Controller 122 may interface with one or more memory dies 108. In in one embodiment, Controller 122 and multiple memory dies (together comprising non-volatile storage system 100) implement a solid-state drive (SSD), which can emulate, replace or be used instead of a hard disk drive inside a host, as a NAS device, etc. Additionally, the SSD need not be made to work as a hard drive.

Figure 4:
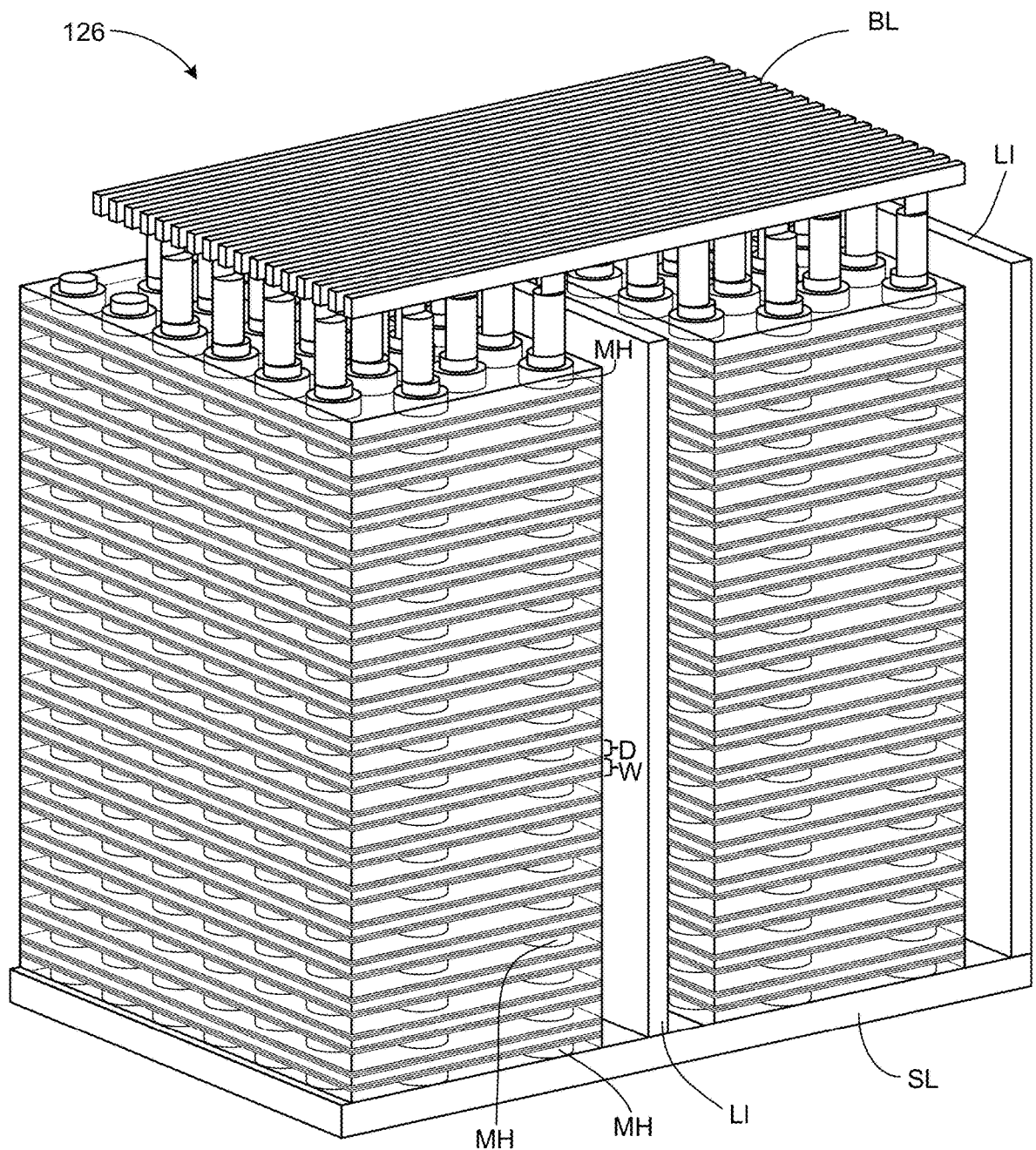
FIG. 4 is a perspective view of a portion of one embodiment of a three-dimensional monolithic memory structure.

FIG. 4 is a perspective view of a portion of a monolithic three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided below with respect to FIG. 4A-4F.

Figure 4A:
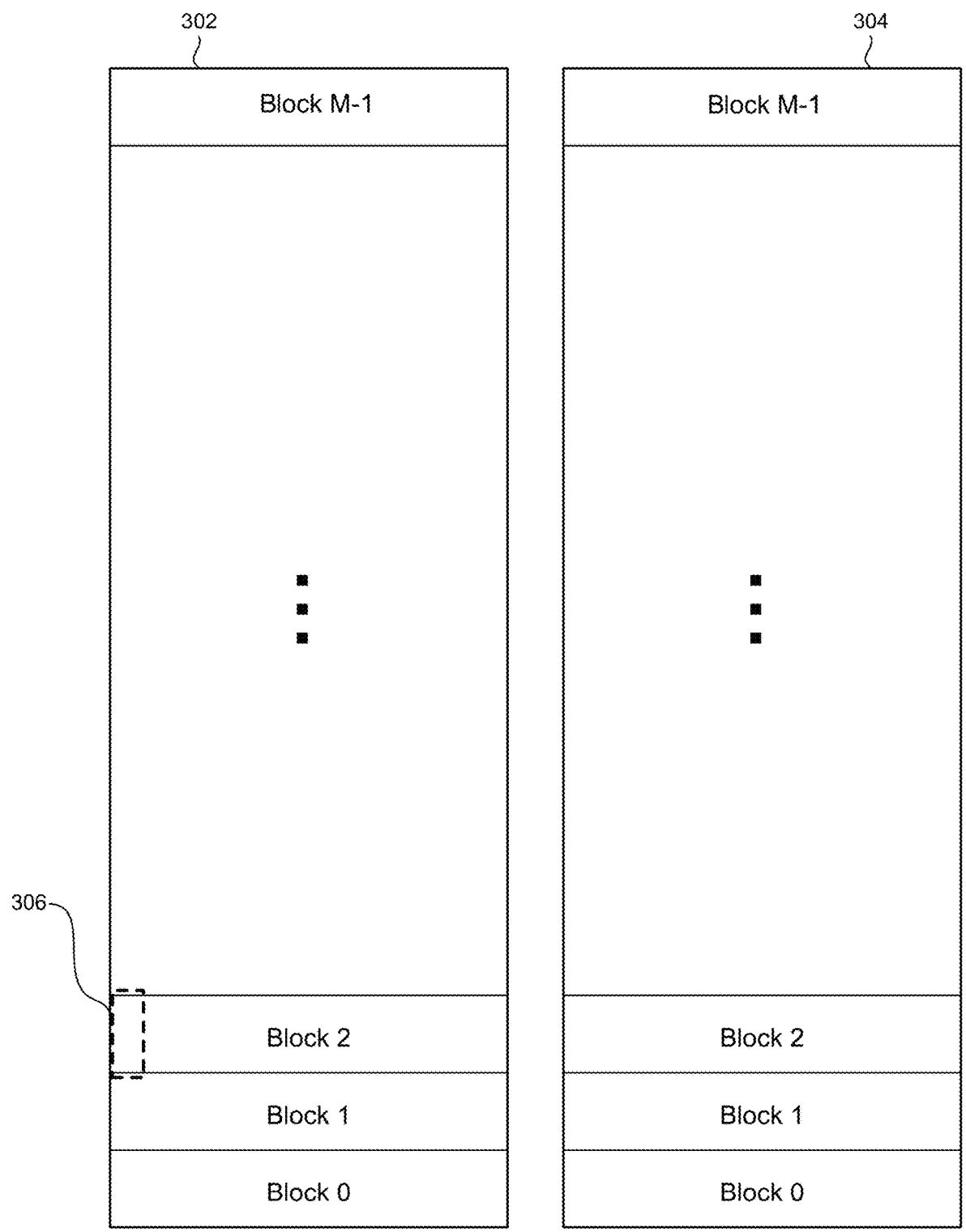
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memories, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
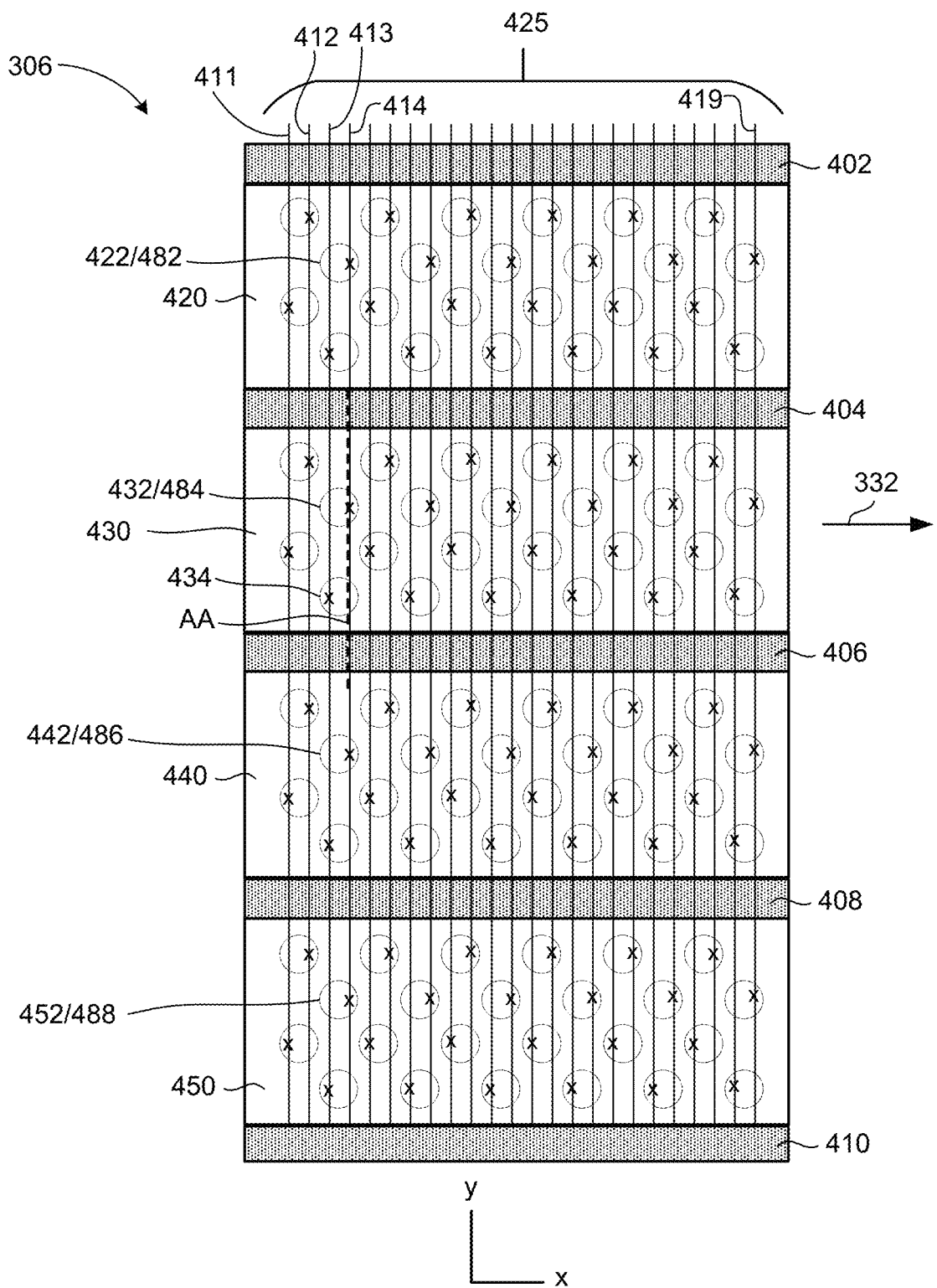
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 425, including bit lines 411, 412, 413, 414, . . . 419. FIG. 4B shows twenty-four-bit lines because only a portion of the block is depicted. It is contemplated that more than twenty-four-bit lines connected to vertical columns of the block. Each of the circles representing vertical columns has an "x" to indicate its connection to one-bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
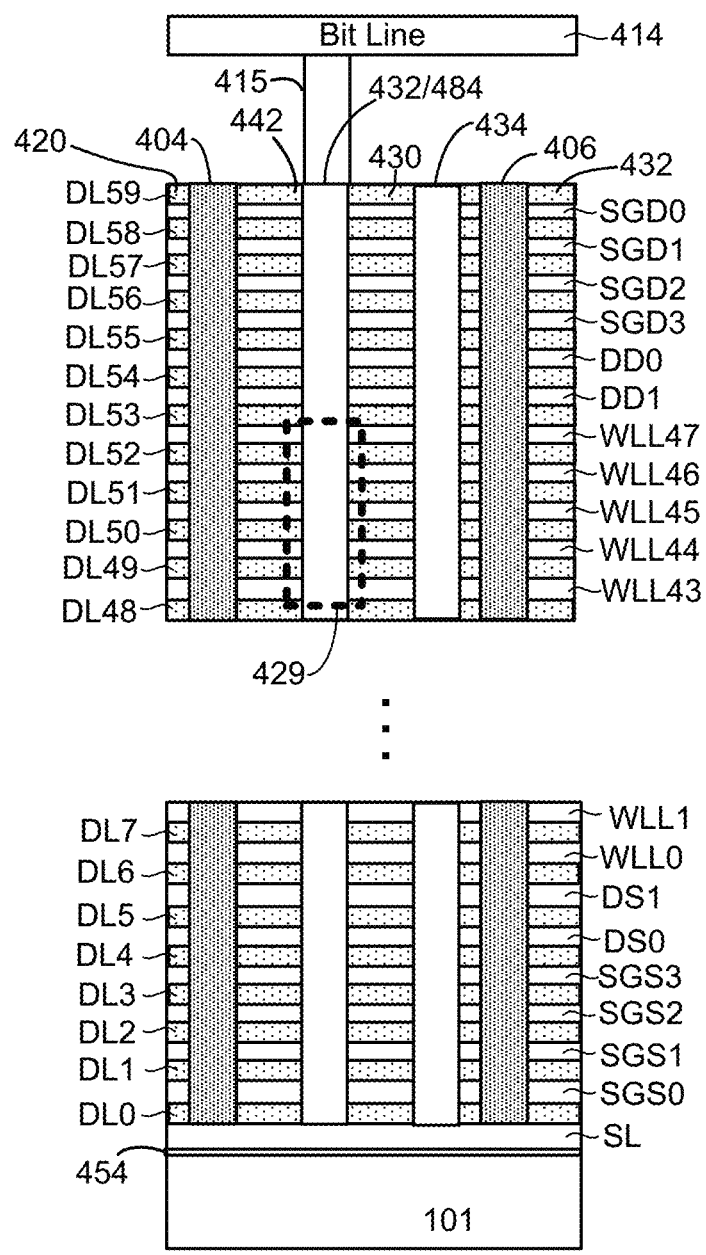
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or less than four dummy word line layers, and more or less than forty-eight-word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO2. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment, local interconnects 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core 470 that is made of a dielectric, such as SiO2. Other materials can also be used. Surrounding inner core 470 is a polysilicon channel, channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide layer 478 (SiO$_2$). The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming a non-volatile storage system is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
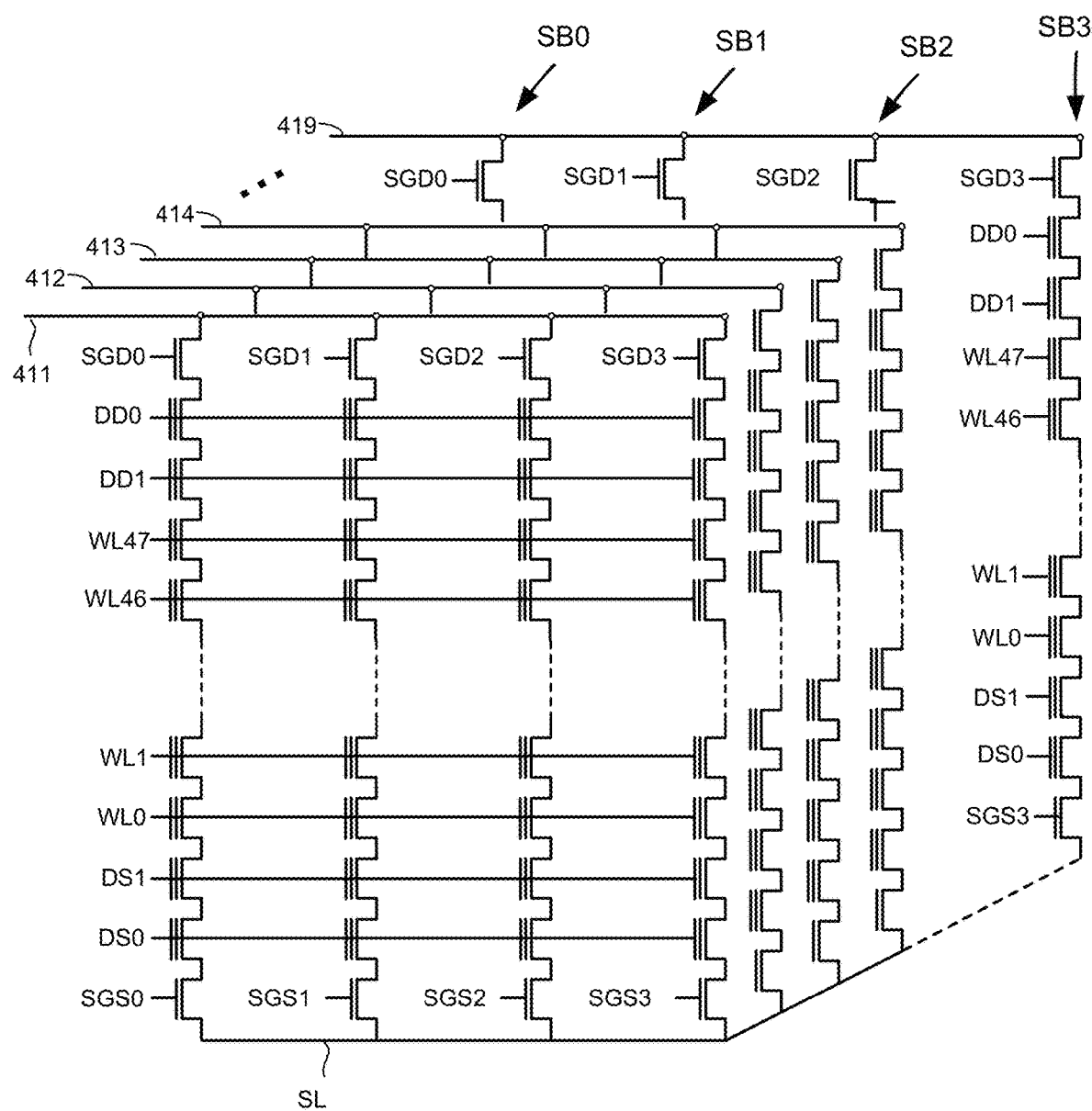
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse but includes a (continuous or non-continuous) vibration or burst of sound, current, voltage light, or other wave.

In many non-volatile storage systems, errors may occur in raw data that is read from memory and an ECC encoder/decoder (e.g. ECC engine 224 of FIG. 3) may be used to detect and correct such errors before data is sent to a host.

Figure 5:
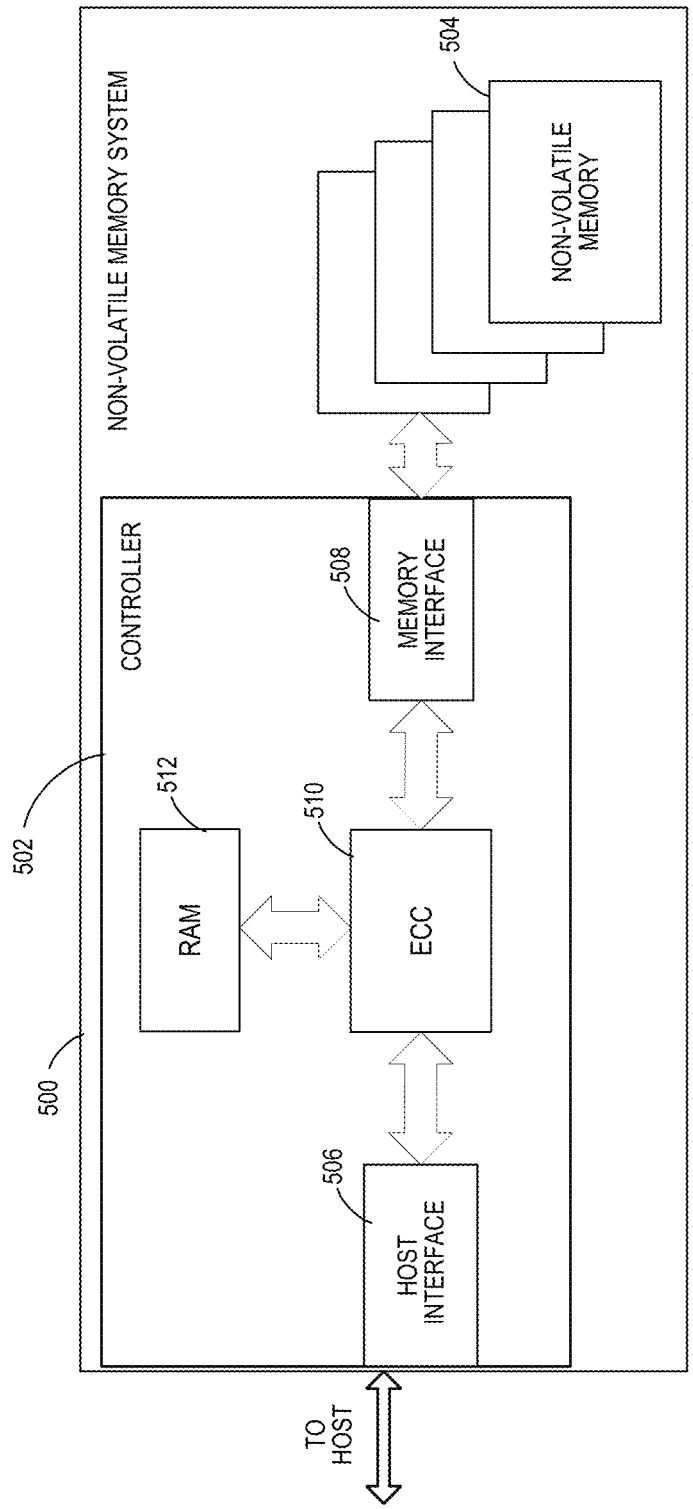
FIG. 5 shows an example of a non-volatile memory system.

FIG. 5 illustrates some components of a non-volatile memory system 500 that includes control circuits of a memory controller 502 in communication with non-volatile memory 504. Memory controller 502 includes a host interface 506 for communication with a host and a memory interface 508 for communication with non-volatile memory 504. An ECC encoder/decoder (or ECC engine), ECC decoder 510, is between host interface 506 and memory 508 to encode data received from a host prior to storing it in non-volatile memory 504 and to decode raw data read from non-volatile memory 504 prior to sending it to a host. The term "decoder" or "ECC decoder" is used here to refer to an ECC module or ECC machine that may perform both encoding and decoding or may perform decoding alone.

ECC decoding may include performing multiple iterations to attempt to find a solution, e.g. by flipping bits to obtain an ECC codeword. RAM 512 is coupled to ECC decoder 510 to allow ECC decoder 510 to save outputs from different iterations. While a single memory, RAM 512, is shown coupled to ECC decoder 510, some ECC decoders may have multiple memories to store data (e.g. different RAM to hold different decoding data). Aspects of the technology presented here are not limited to any particular arrangement of memory. In some memory controllers, RAM used by an ECC decoder may represent a significant cost and may consume significant power.

Figure 6A:
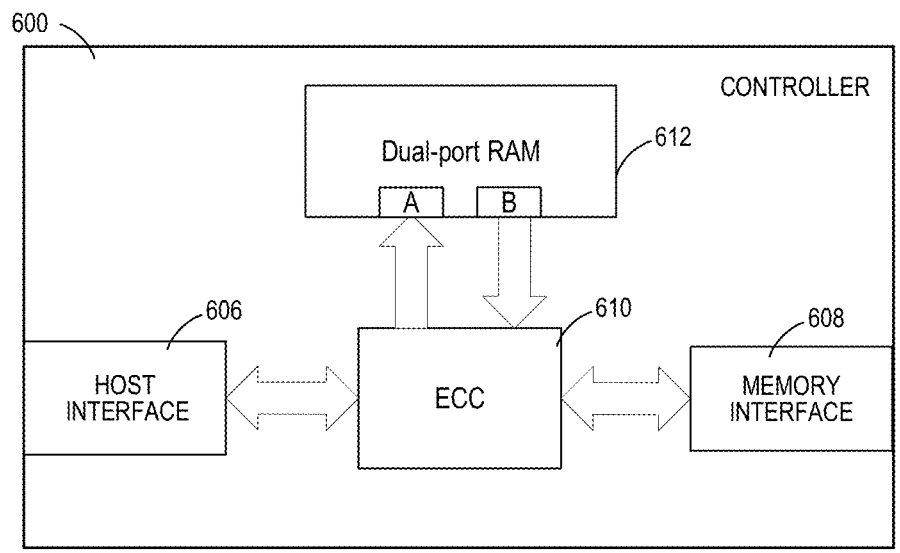
FIG. 6A shows an example of control circuits including an ECC decoder and a dual-port RAM memory.

FIG. 6A illustrates an example of a non-volatile memory controller, controller 600, that includes an ECC decoder 610 between a host interface 606 and a memory interface 608. ECC decoder 610 is coupled to a dual-port memory 612 (dual-port RAM) so that data generated by ECC decoder 610 when iteratively decoding data may be written and read rapidly. A dual-port memory allows data to be written via one port while data is read via the other port. For example, on a given clock cycle, ECC decoder may write data in dual-port memory 612 through Port A and read data from dual-port memory 612 through Port B. Data stored in dual-port memory 612 is equally accessible through either port so that data can be written to any address in dual-port memory 612 through Port A while any other data in dual-port memory 612 may be read in parallel through Port B. Such parallel access provides high access speeds for a given clock frequency. The term "dual-port" may refer to a memory having two ports where each port can read or write. In contrast, "two-port" may refer to a memory having two ports where one port is a dedicated write port and the other port is a dedicated read port. It will be understood that controller 600 may be implemented with a two-port memory or dual-port memory.

Figure 6B:
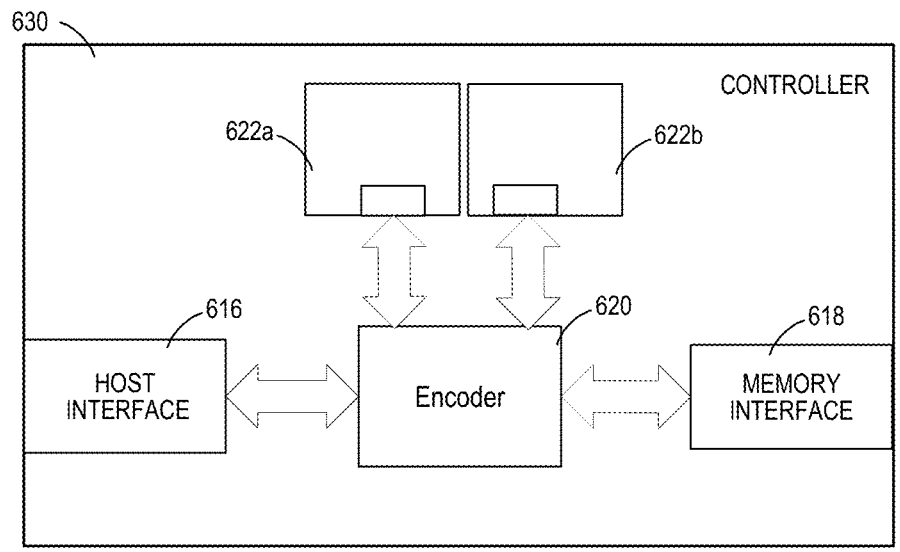
FIG. 6B shows an example of control circuits including an ECC decoder and two single-port RAM memories.

FIG. 6B shows another example of a memory controller 630 that includes ECC decoder 620 between host interface 616 and memory interface 618. ECC decoder 620 is coupled to single-port memory 622a and single-port memory 622b so that data generated by ECC decoder 620 can be stored and retrieved.

Figure 6C:
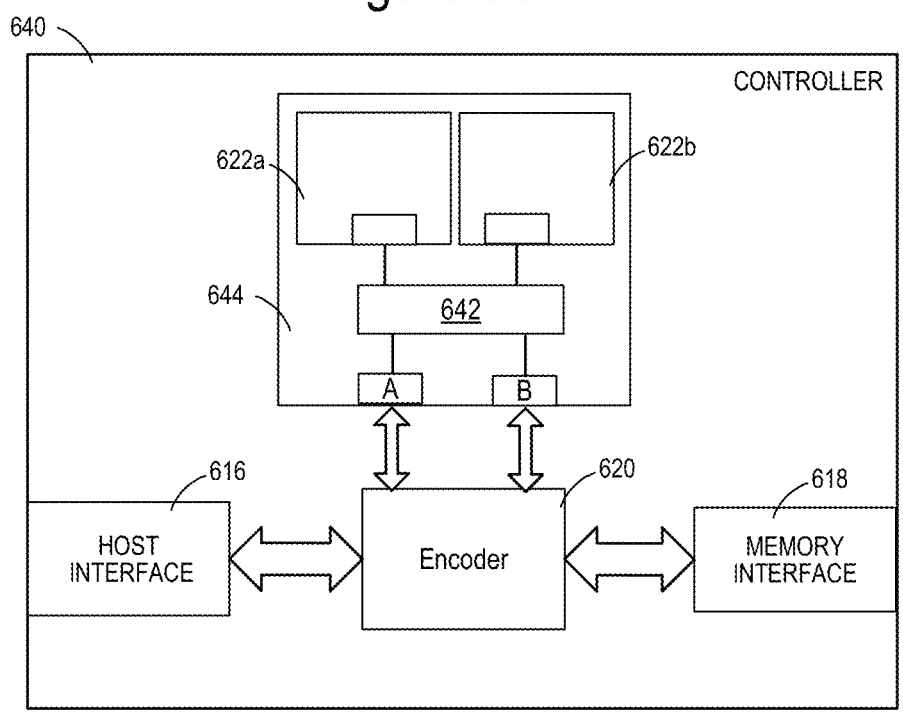
FIG. 6C shows another example of control circuits including an ECC decoder and two single-port RAM memories.

FIG. 6C shows another example of a non-volatile memory controller, controller 640, with single-port memory 622a and single-port memory 622b coupled to ECC decoder 620. In controller 640, single-port memories 622a-b are arranged as two memory banks that share two ports, Port A and Port B, through a routing circuit 642 that allows either port A or B to access either single-port memory 622a or 622b. Thus, routing circuit 642 has two switching configurations, a first configuration in which Port A is coupled to single-port memory 622a and Port B is coupled to single-port memory 622b and a second configuration in which Port A is coupled to single-port memory 622b and Port B is coupled to single-port memory 622a. This allows interleaving of access between single-port memories. While this arrangement allows the entire physical memory space of combined single-port memories 622a-b to be accessed through Ports A and B, parallel access is limited to accessing the two single-port memories in parallel (i.e. cannot have two parallel operations accessing the same single-port memory). Thus, on a given clock cycle, if Port A is coupled to single-port memory 622a to access an address in single-port memory 622a then another operation may access an address in single-port memory 622b through Port B in parallel but may not access another address in single-port memory 622a. While routing circuit 642 is shown as being internal to memory unit 644 (i.e. between Ports A-B and single-port memories 622a-b) in this example, in other examples, routing may be implemented outside memory unit 644 (e.g. between ECC decoder 620 and memory unit 644).

Figures 7, 8:
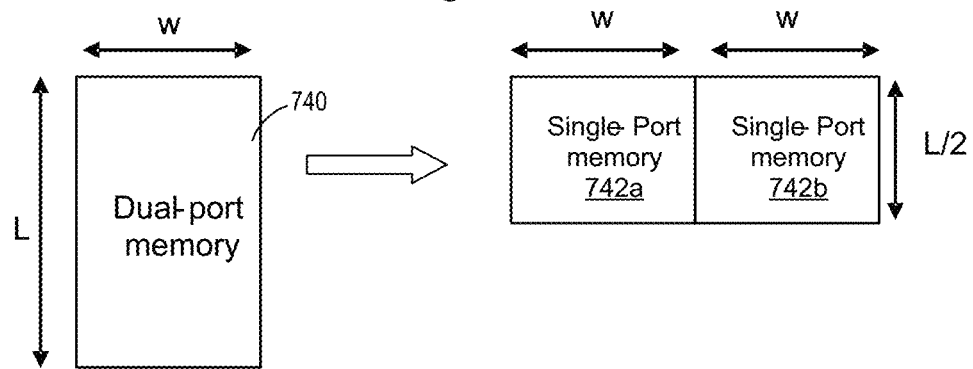
FIG. 7 shows a comparison of dual-port memory and single-port memories.
FIG. 8 illustrates some differences between dual-port and single-port memory.

FIG. 7 illustrates a comparison between dual-port memory and single-port memory (e.g. between dual-port memory 612 of FIG. 6A and single-port memories 622a-b of FIGS. 6B-C). A dual-port memory 740 is shown with a number of memory cells (number of bits) that is L*W (where L is the number of cells along a column and W is the number of cells along a row that may be accessed in parallel e.g. read W bits together in a given clock cycle). Similarly, single-port memories 742a and 742b collectively have a number of cells that is L*W. In some applications, either arrangement may be used with some advantages and disadvantages to different arrangements. For example, a dual-port memory with capacity to store 28 KB may be replaced with two single-port memories that store 14 KB each (e.g. a dual-port memory with 72 lines may be replaced by two single-port memories of 36 lines each).

FIG. 8 illustrates differences that may be found between examples of single-port and dual-port memories. The first line shows single-port memory as having 100% area and power (i.e. single-port memory, as shown on the right of FIG. 7, is provided as a baseline for comparison). The second line shows an example of ultra-high-density two-port memory (or dual-port memory) that maintains the same footprint (100% area) and uses 160% of the power used by the single-port example. The third line shows an example of high-density two-port memory (or dual-port memory) that maintains the same power consumption as single-port memory (i.e. 100% power) and uses 200% of the area required for a single-port design (200% area). Thus, it can be seen that there can be significant advantages to using single-port memory rather than dual-port or two-port memory in terms of area and/or power consumption.

FIG. 9 illustrates an example of a dual-port memory (e.g. dual-port memory 612 of FIG. 6A) operating on two sequential streams of data in parallel (e.g. a stream of reads of data with addresses 100 to 107 and a stream of writes of data with addresses 672 to 679). These streams may correspond to iterations in decoding different raw data by an ECC decoder, for example, or may correspond to other data stored in a dual-port memory. Data 100 to 107 is read through Port A of the dual-port memory while data 672 to 679 is written in parallel through Port B. Clock cycles are shown along the top line. It can be seen that on every clock cycle, both a read operation and a write operation are performed in parallel, e.g. on clock cycle 0, data with address 100 is read and data with address 672 is written, on clock cycle 1, data with address 101 is read and data with address 637 is written, and so on.

FIG. 10 illustrates an example of two single-port memories (e.g. single-port memories 622a-b of FIG. 6C) operating on the same sequential streams of data as shown in FIG. 9. In the example of FIG. 10, each single-port memory is assigned half of the logical addresses (i.e. the logical address space is partitioned with half of the logical address space assigned to each single-port memory) by assigning odd addresses to one single-port memory and even addresses to the other single-port memory. Thus, accesses to odd addresses (heavily shaded in FIG. 10) are access to a first single-port memory (e.g. single-port memory 622a) while access to even addresses (lightly shaded in FIG. 10) are accesses to a second single-port memory (e.g. single-port memory 622b). On clock cycle 0, both Port A and Port B handle even addresses (addresses 100 and 672 respectively). Since all even addresses are assigned to the same single-port memory there is a conflict because these accesses cannot be handled in parallel and one access must wait for a clock cycle. In this case, Port B waits to access address 672 ("672(w)") until the next clock cycle. Subsequently, on clock cycle 1, Port A handles an odd address, address 101, while Port B proceeds with even address 672 in parallel. Subsequently, both single-port memories are accessed in parallel on each clock cycle as Port A and Port B alternate in accessing odd and even addresses according to the sequences they handle. A routing circuit, such as routing circuit 642 may provide such interleaved access by switching between configurations on each clock cycle. Thus, after an initial clock cycle with only one access, the two sequences are offset to ensure odd/even pairing of addresses that facilitates parallel access to the two single-port memories. Such an arrangement may allow single-port memory to be used efficiently in applications where memory access is sequential (e.g. to handle two sequences as shown in FIG. 10).

Where access is not sequential (e.g. where addresses to be accessed are random, or non-sequential) using single-port memory may be challenging. For example, in some cases, an iterative ECC decoder, such as an LDPC decoder may access a memory in a manner that is non-sequential (i.e. does not occur in streams of sequential addresses as shown in FIGS. 9 and 10). For example, an LDPC decoder may store probability data associated with a codeword and may access chunks of the probability data to attempt to find a solution. These chunks may be accessed non-sequentially. Such a system may have throughput degraded by up to 50% because of wait states that occur when both ports wish to read from the same single-port memory. Thus, using single-port memory in such a system may have a significant impact.

FIG. 11 shows an example of non-sequential accesses by Port A and Port B for a pair of single-port memories that are assigned odd addresses (unshaded) and even addresses (shaded) respectively i.e. logical address space is partitioned between single-port memories based on odd/even addresses. On clock cycle 0, both ports handle even addresses 4, and 6, so that only one (Port A) can proceed and the other (Port B) enters a wait state ("6(w)"). On clock cycle 1, Port B proceeds with address 6 and Port A, which now handles even address 2, must wait. On clock cycle 2, Port A proceeds with address 2 while Port B handles address 5 in parallel. Subsequently, on clock cycle 3, both ports handle odd addresses 47 and 23 requiring another wait state for Port B ("23(w)"). Subsequently, on clock cycle 4, Port B proceeds with address 23 and Port A enters a wait state ("17(w)"). It can be seen that a high number of wait states may occur, and that throughput is significantly affected.

According to an example of the present technology, single-port memories may be configured to provide a high throughput and avoid wait states associated with simultaneous requests to access the same single-port memory. Data stored in two or more single-port memories may be read from its location, in whichever memory it was stored, while data is written in another single-port memory in the same clock cycle. Thus, for a pair of single-port memories, whichever single-port memory is not busy with a read access is used for a parallel opportunistic write access. This means that destinations for writing data are assigned dynamically according to ongoing read accesses rather than based on a predetermined static assignment of addresses to single-port memories (such as the odd/even assignment scheme described above). A logical to physical map may be maintained to record locations in physical memory where particular data is stored (i.e. record a physical address for each logical address of data stored) thus maintaining a record to track data (which may be stored at a location in either single-port memory). Such a scheme may allow single-port memories to handle non-sequential access in an efficient manner. While some additional overhead may be required (e.g. maintaining a logical to physical map or table) the cost and/or power benefits may outweigh any such disadvantage.

FIG. 12 shows an example of handling non-sequential access in a pair of single-port memories (e.g. single-port memories 622a-b of FIG. 6C) that uses dynamic assignment of logical addresses to single-port memories. FIG. 12 shows the same sequence of accesses as in FIG. 11 with access to a first single-port memory (e.g. single-port memory 622a) shown by unshaded entries and access to a second single-port memory (e.g. single-port memory 622b) shown by shaded entries. For simplicity in this example, Port A handles reads while Port B handles writes (in other examples, reads and writes may be mixed on both ports). On a clock cycle 0, Port A handles a read of data with logical address 4 from the physical location where it is stored in the first single-port memory so that data with logical address 6 from Port B is written to the second single-port memory (i.e. to the single-port memory that does not contain the location storing data with logical address 4 and that is not busy with the corresponding read command). The assignment of logical address 6 to the second single-port memory is made in response to a determination that the first single-port memory is busy and is an example of dynamic assignment (not the result of a predetermined assignment). On clock cycle 1, data with address 2 is read from the second single-port memory (where it was previously written) so that the first single-port memory is not busy with a read command and is selected for writing data with logical address 5 from Port B. On clock cycle 2, data with address 47 is read from the first single-port memory so that the second single-port memory is not busy with a read command and is selected for writing data with logical address 23. On clock cycle 3, data with address 17 is read from the first single-port memory so that the second single-port memory is not busy with a read command and is selected for writing data with logical address 8. On clock cycle 4, data with address 20 is read from the second single-port memory so that the first single-port memory is not busy with a read command and is selected for writing data with logical address 11.

Comparing FIGS. 11 and 12, it can be seen that no wait states occur in the example of FIG. 12 so that the number of memory accesses (reads and writes) in clock cycles 0 to 4 is greater in FIG. 12 than in FIG. 11 (10 accesses compared with 6). This represents a significant increase in throughput.

Because a given logical address may be assigned to either of two single-port memories, a table or map may be maintained to track physical locations where data is stored. FIG. 13A shows an example where a memory-using circuit 1302 (such as an iterative ECC decoder, e.g. an LDPC decoder, turbo decoder, or similar decoder) is in communication with a memory system 1300 that includes a first single-port memory 1304a and a second single-port memory 1304b. When the memory-using circuit issues a read and write to Ports A and B at the same time (same clock cycle) memory system 1300 is configured to read stored data on a clock cycle from the physical location of the stored data in the first single-port memory 1304a or second single-port memory 1304b (whichever memory it is stored in) and configured to initiate a write of fresh data on the clock cycle to whichever of the first single-port memory 1304a or the second single-port memory 1304b does not contain the physical location.

Memory system 1300 includes routing circuit 1306, which is configured to route data between ports A-B and single-port memories 1304a-b. Routing circuit 1306 is connected to logic circuit 1308, which controls configuration of routing circuit 1306 according to a table 1310. For example, when a read command is received at Port A, logic circuit 1308 may look at table 1310 to determine the location of the data to be read, e.g. by searching table 1310 using the logical address from Port A to identify a physical address in either single-port memory 1304a or 1304b. Logic circuit 1308 then configures routing circuit 1306 to direct the read to the corresponding physical location. A write command received at Port B in parallel is sent to the other single-port memory 1304a or 1304b, i.e. to whichever of the first single-port memory 1304a or the second single-port memory 1304b does not contain the physical location indicated by the physical address. Thus, if the read is directed to a physical location in first single-port memory 1304a, then logic circuit 1308 selects a location in second single-port memory 1304b to write data so that both single-port memories 1304a and 1304b are accessed in parallel. Logic circuit 1308 may be configured to update the table 1310 with a physical location of any fresh data when it is written, e.g. by updating every clock cycle.

FIG. 13B shows an alternative arrangement in which logical to physical translation is performed between memory-using circuit 1302 and memory system 1350. A translation circuit 1322 is located between memory using circuit 1302 and Ports A and B of memory system 1350. Logic circuit 1324 uses table 1326 to identify physical addresses corresponding to logical addresses received from memory-using circuit 1302. Corresponding commands are generated and sent to Ports A and B. For example, when a read command is received for Port A, logic circuit 1324 may look at table 1326 to determine the location of the data to be read, e.g. by searching table 1326 using the received logical address to identify a physical address in either single-port memory 1304a or 1304b. Logic circuit 1324 then generates a modified command accordingly to direct the read to the corresponding physical location. This may be sent to either Port A or Port B. A write command received for Port B in parallel is sent to the other single-port memory 1304a or 1304b, i.e. to whichever of the first single-port memory 1304a or the second single-port memory 1304b does not contain the physical location indicated by the physical address. Thus, if the read is directed to a physical location in first single-port memory 1304a, then logic circuit 1324 selects a location in second single-port memory 1304b to write data so that both single-port memories 1304a and 1304b are accessed in parallel. Logic circuit 1324 may be considered a means for identifying a destination for writing an output or interim results of an iterative decoder or other data in a first single-port memory or a second single-port memory. Logic circuit 1324 also identifies a physical location in the first single-port memory or the second single-port memory for a parallel read operation according to a logical to physical map. The destination for writing may be identified from whichever of the first single-port memory or the second single-port memory does not include the physical location indicated for the read operation by the logical to physical map.

Logic circuit 1324 updates table 1326, which indicates the physical location of the stored data in either the first single-port memory 1304a or the second single-port memory 1304b. Logic circuit 1324 may be configured to update the table 1326 with a physical location of any fresh data in this manner and may be considered a means for updating the logical to physical map according to destinations identified for writing outputs of an iterative decoder or other data. While a routing circuit 1328 is provided in memory system 1350 in this example, this may be a simple switch that does not require a table and logic circuit, and may have just two configurations (e.g. Port A to single-port memory 1304a and Port B to single-port memory 1304b, or Port A to single-port memory 1304b and Port B to single-port memory 1304a). In other examples, routing circuit 1328 may not be provided and all switching and routing functions may be performed by translation circuit 1322, logic circuit 1324, and table 1326.

FIG. 14 shows an example of a map or table such as table 1310 or table 1326 that indicates the physical location of the stored data in either the first single-port memory or the second single-port memory. Each line may correspond to a logical address as indicated in the left column with a corresponding physical address in the right column. Thus, data with logical address 0 is stored at physical address 23, data with logical address 1 is stored at physical address 4, and so on for the N logical addresses of the example. Physical addresses are equally divided between the first and second single port memories, e.g. physical addresses 0 to N/2−1 may be in the first single-port memory and physical addresses N/2 to N−1 may be in the second single-port memory, or odd physical addresses may be in the first single-port memory and even physical addresses may be in the second single-port memory, or some other division may be applied. When a read request is received, the corresponding physical address may be rapidly obtained from such a table and a physical address in the other single-port memory may be identified as a destination for a parallel write. These entries are updated as fresh data is dynamically assigned in order to write in parallel with reading. It will be understood that such a table may be small compared with single-port memories 1304a-b. For example, for a 4 KB codeword that is decoded using 7 bits to represent probability for an individual codeword bit, 28 KB of RAM capacity may be required to store probability data associated with an individual 4 KB codeword. Such probability data may be updated in chunks that can be individually read and written. For example, a chunk may correspond to a line in RAM. In one example, a codeword corresponds to 72 chunks with probability data for each chunk stored in a separate line in RAM (e.g. stored in 72 lines in a dual-port memory or 36 lines each in two single-port memories). A logical to physical map or table of such a physical memory space with 72 addresses may represent less than 1% of the RAM size so that such a table may be stored using a small additional RAM, which may be considered a means for storing the logical to physical table or map.

One challenge in a memory system such as memory system 1300 and 1350 is possible uneven or unequal use of the two single-port memories, or "bias." FIG. 15 shows an example of non-sequential access to a pair of single-port memories (e.g. single-port memories 1304a and 1304b of FIGS. 13A-B) using dynamic assignment to assign logical addresses to physical addresses in the first or second single-port memory. Clock cycles are shown on the top row, read accesses (from either port) on the second row, write accesses (from either port) on the third row, and bias on the fourth row. Because bias may cause more data to be stored in one memory, it may require some additional capacity to handle the increased number of writes to the memory so that there may be a cost associated with handling any bias. Access to the two single-port memories is shown by shading, with access to a first single-port memory unshaded and access to a second single-port memory shaded. For clock cycles 0 to 6, only reads occur and there is no bias at this time. Subsequently, four writes (logical addresses 0, 8, 17, and 47) are directed to the second single-port memory causing bias to increase from 1 to 4 over clock cycles 7 to 10. Subsequently, four reads (logical addresses 11, 12, 43, and 44) are directed to the second single-port memory and in parallel four writes (logical addresses 77, 4, 5, and 33) are directed to the first single-port memory thereby reducing bias from 4 back to 0 over clock cycles 11 to 14. Because of bias, two single-port memories each with sufficient capacity to hold n/2 chunks of data may not be sufficient to replace a dual-port memory with capacity to hold n chunks of data (e.g. for an iterative decoder that uses n individually addressable chunks of data to represent a codeword). The larger the bias, the more additional capacity may be required to accommodate data in a pair of single-port memories. For some iterative decoding systems, a static predetermined partitioning of logical space between single-port memories (e.g. odd/even partitioning discussed above) may require an additional 25% memory capacity because of bias.

According to an aspect of the present technology, a logical to physical map of a logical address space to a physical memory space that includes a first single-port memory and a second single-port memory (e.g. 1304*a* and 1304*b*) may be initialized according to an initial mapping to provide low bias. For example, some iterative decoders access data according to a pattern that is reasonably predictable. A model of decoder access may be generated and may be used to predict bias. Such a model may be based on observation of an iterative decoder acting on real data (e.g. during testing, or by logging decoder output during operation). Thus, data such as shown in FIG. 15 may be recorded to track bias over time. Such a model may also be simulated by software (iterative decoder output may be predicted by software). Thus, a worst-case scenario may be obtained that indicates the worst bias that is likely to be generated. Single-port memory may be sized accordingly to accommodate worst-case bias. Thus, where a worst-case bias is 4, as shown in FIG. 15, then 4 additional lines may be needed.

When a decoder powers up there is no data in RAM to read, so a scheme that writes to single-port memories that are not busy with a read as described above is free to write data to either single-port memory. Some initial mapping may be used in this situation. It has been found that choosing an appropriate initial mapping can provide low bias and thus allow use of memory of smaller capacity. Choosing an appropriate initial mapping may include starting with a default mapping scheme (e.g. odd/even assignment, or some other simple assignment scheme) and modeling bias as assignments are changed. In this way, an initial assignment scheme may be obtained that provides low bias for a given use pattern. Such an initial assignment scheme may be developed during product development and may be stored in hardware, or may be stored as part of firmware, or otherwise. In some cases, an initial mapping may be updated to reflect a different pattern of memory access.

FIG. 16 illustrates an example of a method that includes initializing a logical to physical map of a logical address space to a physical memory space according to an initial mapping, the physical memory space includes a first single-port memory and a second single-port memory 1660. For example, the initial mapping may be obtained by simulating memory access patterns for different mappings to determine an initial mapping that provides low bias. The method further includes writing fresh data at locations in the first single-port memory and the second single-port memory according to the initial mapping during an initial period of operation 1662. Thus, initially (for some initial clock cycles), when a memory has no entries, or few entries, and no reads, or few reads are performed, data is written at locations indicated by the initial mapping. Subsequent to the initial period of operation, the method includes writing fresh data on a clock cycle to whichever of the first single-port memory or the second single-port memory is not busy with a read command on the clock cycle 1664. Thus, subsequent to the initial period of operation, instead of following the initial mapping, or any other predetermined mapping, data is assigned to a single-port memory dynamically and is written in whichever single-port memory is not busy performing a read command.

Figure 17:
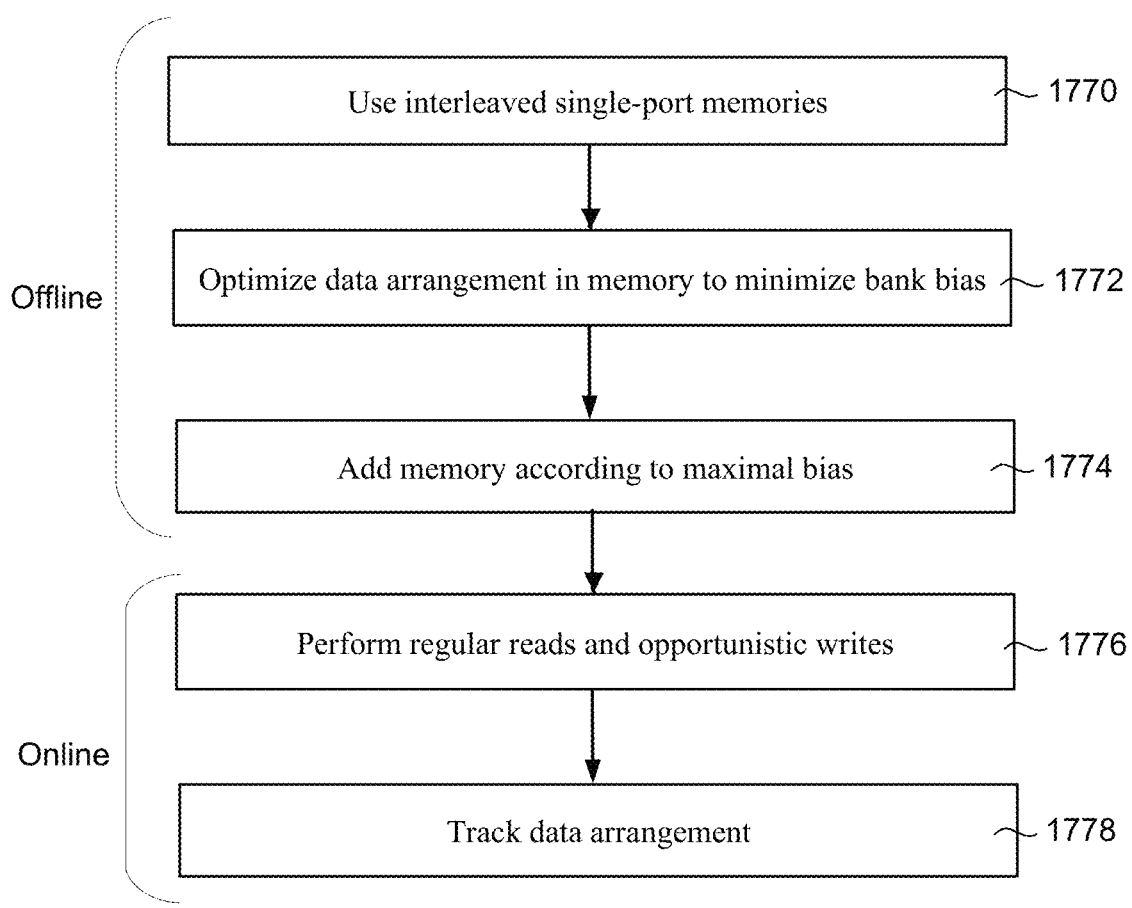
FIG. 17 illustrates an example of offline and online steps.

FIG. 17 illustrates aspects of the present technology including offline configuration that may be performed during product development and online steps that may be implemented during operation of a product. Interleaved single-port memories are used 1770 and may be coupled to one or more memory-using circuits such as ECC encoders. For example, two single-port memories may be used rather than a single dual-port memory. Data is arranged in single-port memories to minimize bank bias 1772 ("bank bias," "memory bias", or "bias," i.e. the tendency for one memory or bank to receive more writes than another bank when using dynamic assignment of logical addresses to physical addresses). Thus, an initial mapping may be generated to arrange data in memory for low bias during operation. Memory is added according to the maximal bias 1774. Thus, the capacity of two single-port memories may be larger than a single dual-port memory for the same application, with the added memory reflecting bias. Steps 1770, 1772, and 1774 may be performed offline, during product development, prior to shipping a product to a customer. Optimizing data arrangements may also be performed online in order to update a data arrangement.

During online operation of the product, regular reads and opportunistic writes are performed 1776. A regular read may be directed to a location in a single-port memory indicated by a logical to physical map, while an opportunistic write performed in parallel with the regular read may be directed to a location in the single-port memory that is otherwise idle because it does not include the location. The data arrangement is tracked 1778 by maintaining a logical to physical map or table linking logical addresses with physical addresses in the single-port memories. In some cases, some data rearrangement may be made online to reduce bias, e.g. in some cases addresses may be swapped between single-port memories in order to reduce bias during operation. For example, changing patterns of access may increase bias and some change to data mapping may be made in response.

An example of an apparatus includes a first single-port memory, a second single-port memory, and one or more control circuits in communication with the first single-port memory and in communication with the second single-port memory, the one or more control circuits configured to initiate a read of stored data on a clock cycle from a physical location of the stored data in the first or second single-port memory and configured to initiate a write of fresh data on the clock cycle to whichever of the first single-port memory or the second single-port memory does not contain the physical location of the stored data.

The apparatus may further include a table that indicates the physical location of the stored data in either the first single-port memory or the second single-port memory. The one or more control circuits may be configured to update the table with a physical location of the fresh data. The apparatus may further include a plurality of stored initial table entries to initialize the table, the one or more control circuits configured to write data at locations indicated by the plurality of stored initial table entries on initial clock cycles. The apparatus may further include an iterative decoder and the stored data, and the fresh data may represent bit probabilities of a decoding operation. The apparatus may further include a set of non-volatile memory cells, the iterative decoder configured to receive data read from the set of non-volatile memory cells and perform iterative decoding of the data read from the set of non-volatile memory cells. The iterative decoder may be a Low-Density Parity Check (LDPC) decoder and the set of non-volatile memory cells may be formed in a NAND flash memory. The Low Density Parity Check (LDPC) decoder may be formed in a controller die and the NAND flash memory may be monolithically formed in one or more physical levels of arrays of memory cells having an active area disposed above a silicon substrate. The apparatus may include an iterative decoder that requires access to stored outputs of n individually addressable chunks of data and the first single-port memory and the second single-port memory may have combined capacity sufficient to hold n individually addressable chunks of data plus excess capacity to allow for memory bias between the first single-port memory and the second single-port memory. The first single-port memory may be a first Static Random Access Memory (SRAM), the second single-port memory may be a second SRAM, and the one or more control circuits may include an iterative Error Correction Code (ECC) decoder. The first single-port memory, the second single-port memory and the one or more control circuits may be interposed between a host interface and a non-volatile memory interface of a non-volatile memory system.

An example of a method includes initializing a logical to physical map of a logical address space to a physical memory space according to an initial mapping, the physical memory space includes a first single-port memory and a second single-port memory, writing fresh data at locations in the first single-port memory and the second single-port memory according to the initial mapping during an initial period of operation, and subsequent to the initial period of operation, writing fresh data on a clock cycle to whichever of the first single-port memory or the second single-port memory is not busy with a read command on the clock cycle.

The method may further include, subsequent to the initial period of operation, reading a portion of stored data on the clock cycle from a physical location in the first single-port memory or the second single-port memory where the portion of stored data is located according to the logical to physical map, writing fresh data on the clock cycle to whichever of the first single-port memory or the second single-port memory is not accessed for reading the portion of stored data; and recording locations of fresh data in the logical to physical map. The method may further include maintaining the logical to physical map in a Random Access Memory (RAM), reading the logical to physical map for each read and updating the logical to physical map for each write to the first single-port memory or the second single-port memory. The method may further include generating the initial mapping from a model of iterations generated by an iterative Error Correction Code (ECC) decoder, the initial mapping generated to provide a low bias between the first single-port memory and the second single-port memory when used to store iterative ECC decoder output or interim results. The initial mapping may be obtained by swapping data assignments between the first single-port memory and the second single-port memory from a default assignment scheme to obtain an assignment scheme that provides low bias. The method may further include reading raw data from a set of non-volatile memory cells, performing a first decoding iteration on the raw data and storing an outcome of the first decoding iteration as fresh data in the first single-port memory or the second single-port memory, and subsequently reading the outcome of the first decoding iteration from the first single-port memory or the second single-port memory and performing a subsequent decoding iteration. The first decoding iteration and the subsequent decoding iteration may be Low Density Parity Check (LDPC) iterations.

An example of an apparatus includes an iterative decoder, a first single-port memory coupled to the iterative decoder, a second single-port memory coupled to the iterative decoder, and means for identifying a destination for writing an output of the iterative decoder in the first single-port memory or the second single-port memory in parallel with reading from a physical location in the first single-port memory or the second single-port memory according to a logical to physical map, the destination identified from whichever of the first single-port memory or the second single-port memory does not include the physical location indicated by the logical to physical map.

The apparatus may further include means for storing the logical to physical map, and means for updating the logical to physical map according to destinations identified for writing outputs or interim results of the iterative decoder.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    a first single-port memory;
    a second single-port memory; and
    one or more control circuits in communication with the first single-port memory and in communication with second single-port memory, the one or more control circuits configured to initiate a read of stored data on a clock cycle from a physical location of the stored data in the first single-port memory and configured to dynamically assign fresh data for writing on the clock cycle to the second single-port memory in response to a determination that the physical location of the stored data is in the first single-port memory.

2. The apparatus of claim 1 further comprising a table that indicates the physical location of the stored data in either the first single-port memory or the second single-port memory.

3. The apparatus of claim 2 wherein the one or more control circuits are configured to update the table with a physical location of the fresh data.

4. The apparatus of claim 3 further comprising a plurality of stored initial table entries to initialize the table, the one or more control circuits configured to write data at locations indicated by the plurality of stored initial table entries on initial clock cycles.

5. The apparatus of claim 1 further comprising an iterative decoder and wherein the stored data and the fresh data represent iterations of a decoding operation.

6. The apparatus of claim 5 further comprising a set of non-volatile memory cells, the iterative decoder configured to receive data read from the set of non-volatile memory cells and perform iterative decoding of the data read from the set of non-volatile memory cells.

7. The apparatus of claim 6 wherein the iterative decoder is a Low Density Parity Check (LDPC) decoder and the set of non-volatile memory cells are formed in a NAND flash memory.

8. The apparatus of claim 7 wherein the LDPC decoder is formed in a controller die and the NAND flash memory is monolithically formed in one or more physical levels of arrays of memory cells having an active area disposed above a silicon substrate.

9. The apparatus of claim 1 further comprising an iterative decoder that requires access to stored outputs of n individually addressable chunks of data and the first single-port memory and the second single-port memory have combined capacity sufficient to hold n individually addressable chunks of data plus excess capacity to allow for memory bias between the first single-port memory and the second single-port memory.

10. The apparatus of claim 1 wherein the first single-port memory is a first Static Random Access Memory (SRAM), the second single-port memory is a second SRAM, and the one or more control circuits include an iterative Error Correction Code (ECC) decoder.

11. The apparatus of claim 1 wherein the first single-port memory, the second single-port memory and the one or more control circuits are interposed between a host interface and a non-volatile memory interface of a non-volatile memory system.

12. An apparatus, comprising:
    an iterative decoder configured to access stored outputs of n individually addressable chunks of data in a decoding operation;
    a first single-port memory coupled to the iterative decoder, the first single-port memory having capacity for outputs of n/2 individually addressable chunks of data plus excess capacity;
    a second single-port memory coupled to the iterative decoder, the second single-port memory having capacity for outputs of n/2 individually addressable chunks of data plus excess capacity; and
    means for identifying a destination for writing an output of the iterative decoder in the first single-port memory or the second single-port memory in parallel with reading from a physical location in the first single-port memory or the second single-port memory according to a logical to physical map, the destination identified from whichever of the first single-port memory or the second single-port memory does not include the physical location indicated by the logical to physical map.

13. The apparatus of claim 12 further comprising:
    means for storing the logical to physical map; and
    means for updating the logical to physical map according to destinations identified for writing outputs or interim results of the iterative decoder.

14. The apparatus of claim 12 wherein the iterative decoder is configured to access the first single-port memory and the second single-port memory non-sequentially.

15. The apparatus of claim 12 wherein the means for identifying a destination is configured to dynamically identify the destination in response to determining the physical location is in the first single-port memory or the second single-port memory.

16. The apparatus of claim 1 wherein the one or more control circuits are coupled between a non-volatile memory and a host interface to decode data read from the non-volatile memory in response to a read command from a host coupled to the host interface.

17. The apparatus of claim 1 wherein the one or more control circuits are configured to decode the data by accessing stored outputs of n individually addressable chunks of data and the first and second single-port memories have combined capacity sufficient to hold more than n individually addressable chunks of data.

18. A method comprising:
    receiving a plurality of read commands directed to first and second single-port memories;
    receiving a plurality of write commands directed to the first and second single-port memories;
    in response to receiving a read command of the plurality of read commands, initiating a read of stored data on a clock cycle from a location in the first single-port memory; and
    in response to identifying the first single-port memory as including the location, dynamically assigning data of a write command of the plurality of write commands to be written on the clock cycle to the second single-port memory.

19. The method of claim 18 wherein the plurality of read commands are received non-sequentially and the plurality of write commands are received non-sequentially.

20. The method of claim 18 wherein the plurality of read commands and the plurality of write commands are received from an iterative decoder that requires access to stored outputs of n individually addressable chunks of data and the first and second single-port memories have combined capacity sufficient to hold more than n individually addressable chunks of data.

* * * * *